United States Patent [19]

Sprenkle

[11] Patent Number: 4,507,861

[45] Date of Patent: Apr. 2, 1985

[54] INSERTION DEVICE FOR AN ELECTRONIC CIRCUIT PACKAGE ASSEMBLY

[75] Inventor: George J. Sprenkle, Phoenixville, Pa.

[73] Assignee: Burroughs Corporation, Detroit, Mich.

[21] Appl. No.: 560,864

[22] Filed: Dec. 12, 1983

[51] Int. Cl.³ .................. H05K 3/30; H05K 13/04
[52] U.S. Cl. ......................................... 29/741; 29/764
[58] Field of Search ............... 29/741, 764, 739, 758, 29/762, 837–839

[56] References Cited

U.S. PATENT DOCUMENTS 3,538,580 11/1970 Bruner ........................... 29/764 X
4,392,301 7/1983 Hannes et al. .................. 29/764
4,468,858 9/1984 Gulberg et al. ................. 29/764

*Primary Examiner*—Carl E. Hall
*Attorney, Agent, or Firm*—Francis A. Varallo; Mervyn L. Young; Kevin R. Peterson

[57] ABSTRACT

A device for handling electronic circuit components, such as integrated circuit packages, and for facilitating the insertion of the pins or leads thereof into corresponding apertures of a printed circuit board. More specifically, an integrated circuit package assembly may comprise a mounted integrated circuit chip, a block-like multi-apertured element for protecting the package leads, and a heat sink member. The present tool, under operation control, captivates the entire package assembly, ejects the protective block prior to package insertion, positions the assembly on the printed circuit board, and inserts the package leads into homologous apertures of the board—the foregoing requiring minimal, if any, physical contact with the assembly by the operator.

10 Claims, 6 Drawing Figures

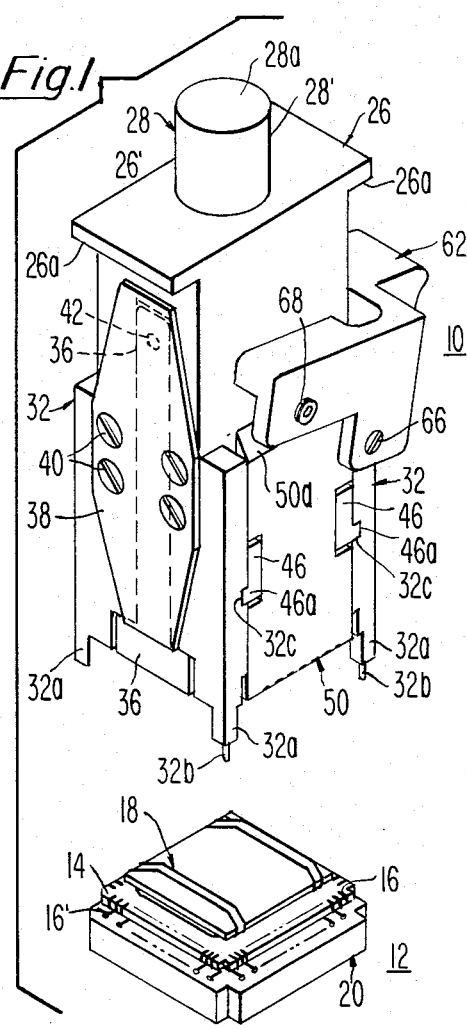
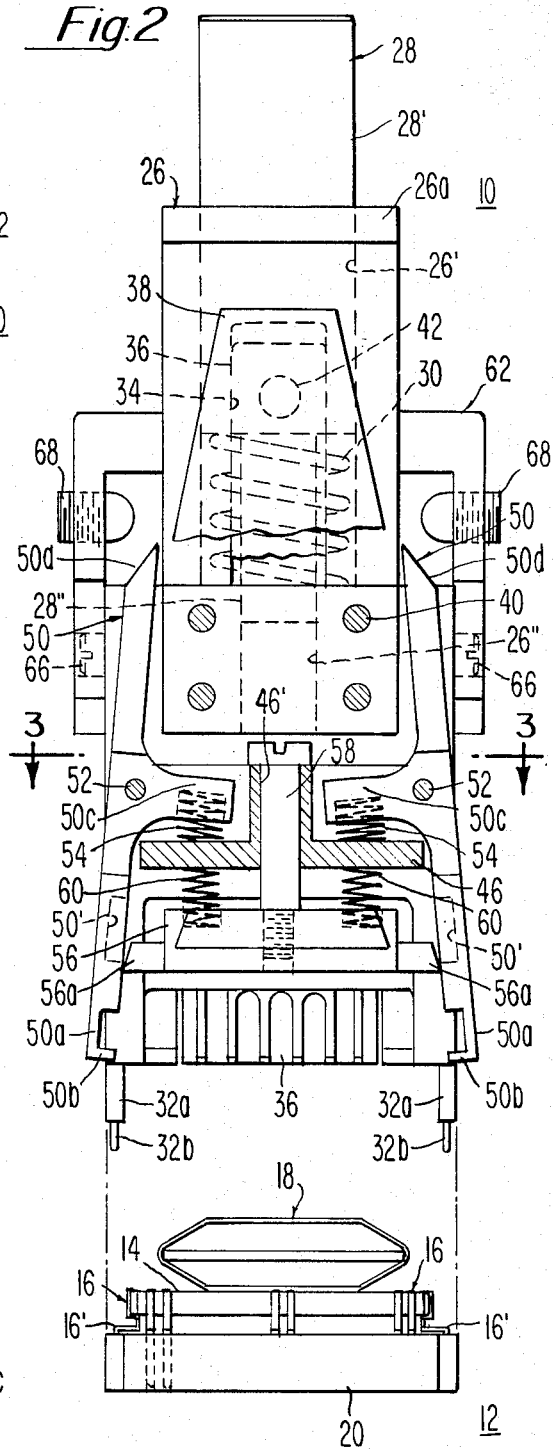
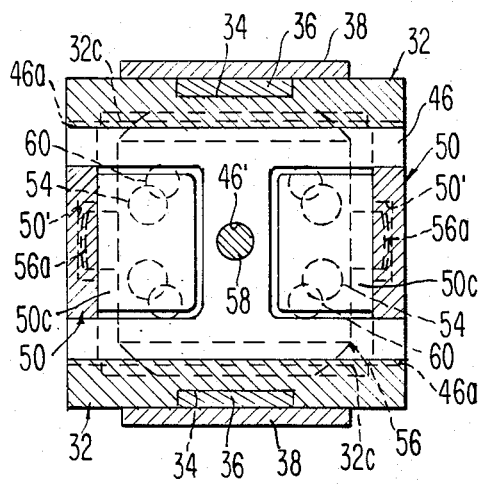

INSERTION DEVICE FOR AN ELECTRONIC CIRCUIT PACKAGE ASSEMBLY

REFERENCE TO COPENDING APPLICATIONS

To the extent that the integrated circuit package assembly handled by the insertion tool of the present invention may utilize a heat sink member of the types disclosed in copending applications, Ser. No. 375,491, "Heat Exchanger for Integrated Circuit Packages" now U.S. Pat. No. 4,421,161 and Ser. No. 395,723, "Wire Form Heat Exchange Element" now U.S. Pat. No. 4,465,130 both by Samuel R. Romania and Grant M. Smith, the foregoing applications, which are assigned to the same assignee as the present application, are referenced herein.

BACKGROUND OF THE INVENTION

In the manufacture of electronic equipment which employs integrated circuit packages, it is necessary to insure that the longitudinal axes of the package leads are oriented respectively at right angles to the planar package surfaces. This lead alignment must be preserved both prior to, and during the insertion of the leads into homologously arranged holes in an interconnection medium, such as a printed circuit board. The problems associated with operator handling of such packages become more acute as the package size, and hence, the number of leads, increase. Such leads tend to be relatively fragile, and consequently are easily bent or otherwise rendered unusable.

In an effort to minimize damage to the package leads, an actual manufacturing process makes use of a block of material having a plurality of apertures for receiving and protecting the leads prior to the mounting of the package on the printed circuit board. However, it will be appreciated that at the latter time, an operator must grasp the protective block and pull it away from the leads. Thereafter, the operator must visually align the package with its mounting position on the board, and insert the leads into corresponding apertures. Such a procedure is tedious and time consuming, and has the potential of damage to the leads, both during the removal of the protective block and the subsequent insertion.

What is required is a production tool which will grasp a complete integrated circuit package assembly, and, which under operator control, will eject the block protecting the leads in a manner to preserve the lead orientation. The tool should then facilitate the alignment of the integrated circuit package leads with the mounting holes in the printed circuit board, and finally, release the package in preparation for the next insertion. The present device fills such a need.

SUMMARY OF THE INVENTION

In accordance with the present invention, there is provided a convenient, time-saving tool which, after loading with a previously prepared integrated circuit package assembly, requires no physical contact by the operator with the assembly during its insertion.

With reference to an actual operative embodiment of the invention, the insertion tool is comprised of an elongated body member of rectangular cross section and a cylindrical shaft, spring-loaded by a coaxial spring, and slidably disposed within a central aperture of said body member. The body member exhibits a narrowed cross section at one extremity thereof. A pair of substantially planar side plates are immovably affixed to the latter narrowed extremity of respective opposite sides of said body member and project therebeyond. The outer surfaces of the side plates are thus coextensive with the principal portions of the sides of the body member. Each of the side plates includes a longitudinal channel for accommodating a slidable, elongated ejector rod. A cover plate retains the rod within the channel. Further, each of the side plates includes at its "free" extremity, a pair of foot-like extensions, such that the assembled tool extremity comprises four extensions (including three with locator pins) which describe the corners of a rectangle substantially the same physical size as the package to be inserted.

The pair of ejector rods are coupled to the aforementioned spring-loaded shaft. A generally "H" shaped support member is immovably affixed between the side plates. A pair of gripper members are pivotally attached to respective opposite sides of said support member within the legs of the "H". Each gripper member has along an extremity thereof, a jaw-like section for engaging opposite sides of the package to be inserted. The gripper members include means for tending to bias the jaw-like sections to a "closed" condition.

A spring-loaded pressure/ejection plate is movably coupled to the aforementioned support member and is disposed within the rectangular cavity in the tool body formed by the side plates and the gripper members.

In use, assuming that the jaws of the gripper member are "open", the operator places the tool over the package assembly. Contact with the upper surface of the assembly with the pressure/ejection plate, causes the latter to release the jaws of the gripper member, which close upon opposed edges of the chip substrate.

With the package secured in place, the lead protector is ejected by depressing the protruding portion of the shaft. The ejector rods push the protective block off in line with the longitudinal axes of the leads.

Finally, the locator pins protruding from three of the four foot-like extensions of the tool provide keying to corresponding apertures in a printed circuit board. Once positioned, the tool is actuated by depressing the jaw-unlatch lever, thereby opening the jaw-like sections and allowing the pressure/ejection plate to insert the package into its proper position on the board.

The jaw-like sections remain "open" in preparation for the next package loading and insertion.

Although the present device has been described in terms of hand operation, the principles of operation embodied therein may be employed in automatic insertion equipment or as part of a robotic assembly. In these cases, activation of the device may be implemented by any of several well known means, such as pneumatic, hydraulic or electrical. Other features and advantages of the invention will become more fully apparent in the detailed description of the tool and its mode of operation which follow.

BRIEF DESCRIPTION OF THE DRAWINGS

FIG. 1 is a pictorial view of the insertion tool of the present invention shown in relation to an integrated circuit package assembly.

FIG. 2 is a side view with portions broken away, of the insertion tool, the latter being in an operator-initiated "open" state prior to the loading of the package assembly.

FIG. 3 is a section view taken along the lines 3—3 of FIG. 2 to better illustrate the internal structure of the insertion tool.

DESCRIPTION OF THE PREFERRED EMBODIMENT

Figure 6:
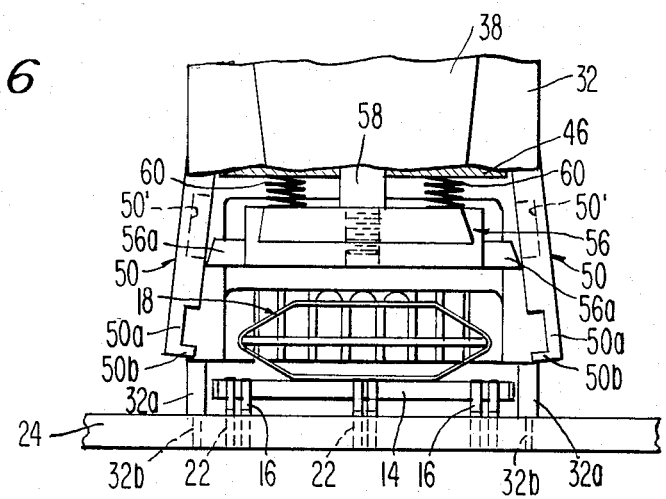
FIG. 6 is a partial view of the tool, with portions broken away, illustrating its return to an "open" state and the resultant ejection of the package into its desired position in a printed circuit board.

As seen in the pictorial view of FIG. 1, the insertion tool 10 of the present invention appears in relation to an integrated circuit package assembly 12. The latter includes an integrated circuit package comprised of a chip or die (not shown) mounted on a substrate 14 and having a plurality of leads 15. Also, in an actual production environment, the assembly comprises a wire-form heat sink member 18 of the type described and claimed in the aforementioned referenced applications, and a multi-apertured block-like member 20 formed, for example, of a thermoplastic resin. The block 20 is designed to protect the package leads 16 from damage and to maintain their orientation from the time of package manufacture to the insertion of the leads 16 into corresponding apertures 22 of a printed circuit board 24 as seen in FIG. 6. The internal structure of the device is apparent for example in the side view of FIG. 2 and the section view of FIG. 3.

With general reference to FIGS. 1-3 inclusive and specific reference to other figures as indicated, the insertion tool 10 is comprised of an assembly of two basic parts, namely, an elongated body member 26 of rectangular cross section and a cylindrical shaft 28. The outer extremity of the body member includes two relatively thin planar sections 26a extending beyond and at right angles to respective opposite sides thereof. The latter sections cooperate with the planar extremity 28a of shaft 28 to facilitate the manual depression of the shaft during operation of the device.

Body member 26 includes a pair of central contiguous concentric bores 26' and 26''. Shaft 28 is provided with a pair of contiguous cylindrical sections, 28' and 28''. The latter sections are accommodated respectively by bores 26' and 26'' of body member 26. Shaft 28 is spring-loaded during operation by means of a coaxial coil spring member 30 which substantially encompasses shaft section 28'', and lies between the inner extremity of bore 26' and the shoulder provided by shaft section 28'.

The body member 26 exhibits a narrowed cross section at one extremity thereof. A pair of substantially planar side plates 32 are immovably affixed to the latter narrowed extremity of respective opposite sides of said body member 26 and project therebeyond. Each of the side plates 32 includes a longitudinal groove or channel 34 (FIG. 3) for accommodating a slidable ejector rod 36, as seen particularly in FIGS. 4 and 5. A cover plate 38 retains the rod 36 within the channel 34. Screws 40 permit the fastening of the cover plate 38 to the side plate 32 and in turn to the body member 26. Further, each of the side plates 32 includes at its "free" extremity, a pair of foot-like extensions 32a. The extremity of the assembled tool 10 thus comprises four extensions, three of which contain locator pins 32b. It is apparent that the extensions 32a describe the corners of a rectangle substantially the same physical size as the package to be inserted. As seen in FIG. 1, the package assembly is keyed for orientation with the insertor 10 by the three notched corners and one chamfered corner on both the substrate 14 and block 20—the latter being accommodated by complementary geometries in the foot-like extension 32a.

Figure 4:
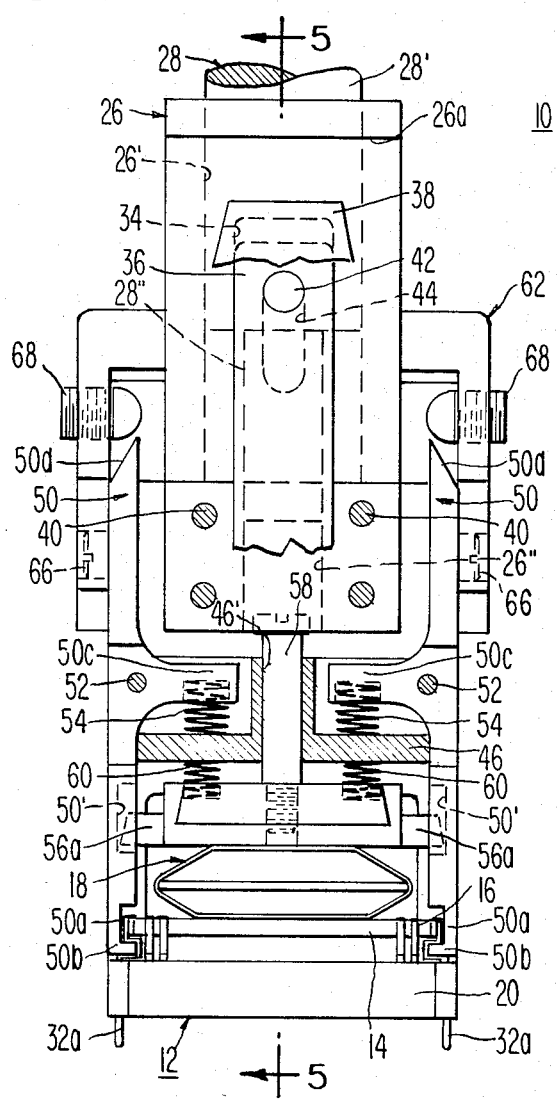
FIG. 4 is a side view of the tool, with portions broken away, illustrating its "closed" state, wherein the package assembly is captivated thereby.
Figure 5:
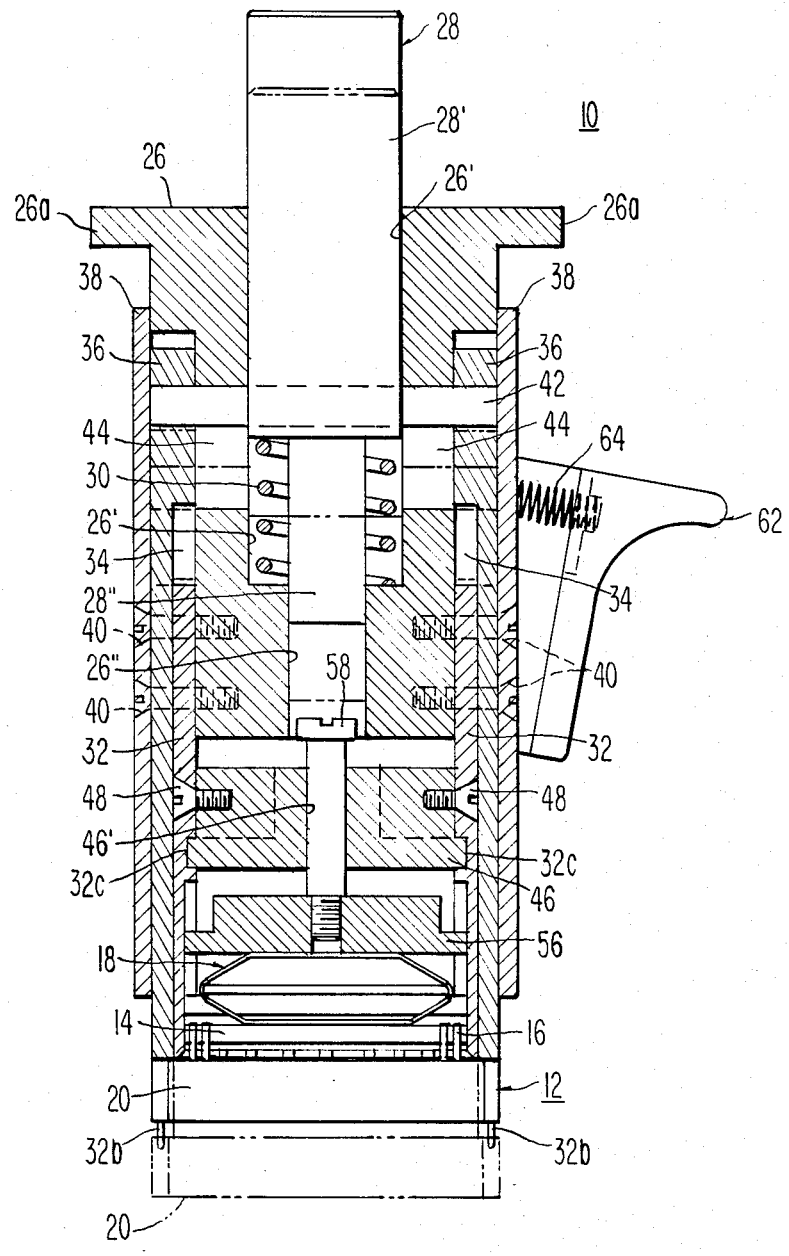
FIG. 5 is a section view of the tool, taken along the line 5—5 of FIG. 4, depicting particularly the removal of the protective block in preparation for the insertion of the package.

As seen in detail in the section view of FIG. 5, the ejector rods 36 are coupled to the shaft section 28' by a pin 42, press-fitted into corresponding apertures in the last mentioned members. Elongated slots 44 (as also seen in FIG. 4) on opposite sides of the body member 26 and leading into bore 26' provide clearance for pin 42.

A generally "H" shaped support member 46, as seen for example in FIGS. 2 and 3, is immovably affixed between the side plates 32. Flanges 46a (FIG. 1) lock member 46 into the side plates 32 via groove 32c therein. Also, screws 48 situated at the respective bottom surfaces of the channels 34 of side plates 32, fasten the latter to the support member 46, as seen in FIG. 5.

A pair of gripper members 50 are pivotally attached by means of pins 52 to respective opposite sides of the support member 46, within the legs of the "H". Each gripper member 50 has along an extremity thereof, a jaw-like section 50a with a plurality of teeth 50b for engaging opposite sides of the package while avoiding the transverse portions 16' of the leads 16. Each gripper member 50 includes a centrally disposed tang 50c which accommodates the respective extremities of at least a pair of springs 54, the opposite extremities of which rest upon an inner surface of the support member 46. The purpose of springs 54 is to bias the jaw-like sections 50a to a "closed" position with respect to the edges of the integrated circuit package substrate 14.

A pressure/ejection plate 56 is attached to the threaded portion of a bolt 58, slidably mounted in aperture 46' of the support member 46 and retained therein by its head. The plate 56 is spring loaded by virtue of springs 60 interposed between adjacent surfaces of the plate 56 and support member 46. As seen particularly in FIGS. 1 and 2, a jaw-unlatch, lever-type mechanism 64 is provided. The latter, which is spring-loaded by springs 64 (FIG. 5) pivots about screws 66, bringing the rounded portions of adjustable set screws 68 into wiping contact with the tapered extremities 50d of the gripper members 50. The compressive force provided by springs 60 is such that upon the overcoming of the closing bias of springs 54 resulting from the cam-like action of the jaw-unlatch mechanism 62, the pressure/ejection plate 56 moves toward the forward extremity of the tool 10. This action permits the projecting pieces 56a of plate 56 to bear against the lower portions of the gripper members 50 and to cause the jaw-like sections 50a thereof to assume an "open" position. The latter, as seen in FIG. 2, may be regarded as a preset condition.

With reference to FIG. 4, while the tool is in the last mentioned preset condition, contact by the surface of the pressure/ejection plate 56 with the top of the assembly 12, such as the upper surfaces of the heat sink wire form 18, causes plate 56 to move upward on bolt 58 and to compress springs 60. The projecting pieces 56a of plate 56 are trapped within the shallow depressions 50' in the gripper members 50 and springs 54 again bias the latter to a closed condition, wherein the jaw-like sections 50a enclose respective edges of the substrate 14.

In order to use the tool, as seen in its rest condition of FIG. 1, the operator pulls the lever of the jaw-unlatch mechanism 62 toward the finger grip extensions 26a of the body member 26. The tapered extremities 50d of the gripper members 50 are wiped by the rounded portions of the set screws 68 and driven toward the body member 26, while compressing springs 54. The tool is now in its preset condition as described hereinbefore. The jaw-like sections 50a are open, as seen in FIG. 2.

The operator then places the tool 10 over the integrated circuit package assembly 12. The four foot-like extensions 32a of the side plates 32 straddle the assembly. As seen in FIG. 4, contact of the uppermost surface of the package assembly, (or of a high profile component itself), with the lower surface of the pressure/ejection plate 56, and upward movement of the latter, permits the jaw-like sections 50a to close upon opposed edges of the assembly 12.

As seen in FIG. 5, with the package assembly 12 secured within the tool 10, the operator depresses the portion 28a of shaft 28 in opposition to spring 30 by utilizing the finger grips 26a of body member 26. Movement of shaft 28, actuates both ejector rods 36 via pin 42, which push the protective block 20 from the package leads 16. The tool 10 is designed such that the block 20 (as seen in phantom) has been ejected straight off and in line with the respective longitudinal axes of the leads, thereby maintaining the required lead orientation for their subsequent insertion. No physical contact by the operator with the protective block is required during its removal. The package is now ready for insertion.

With reference to FIG. 6, the foot-like extensions 32a have been positioned on the printed wiring board 24 by virtue of the locator pins 32b disposed in three of the four extensions to provide a keying function. The locator pins 32b enter three apertures in the board 24 provided for this purpose. The package leads 16 are thereby aligned with and disposed above corresponding holes 22 in the board. The operator then actuates the lever of the jaw-unlatch mechanism 62 allowing the jaw-like sections 50a of the gripper members 50 to open, and the pressure/ejection plate 56 to eject the package and insert the leads 16 into the printed circuit board holes 22. Here again, no physical contact of the operator is required with the package.

After insertion takes place, the tool 10 is in its preset condition, that is, the jaw-like sections 50a remain open because of the latching feature of the pressure/ejection plate 56. The insertion tool 10 may then be removed from the printed circuit board 24 and is ready for the loading of the next package assembly.

Finally, it is believed that the insertion device described herein is a convenient, non-damaging, time-saving means of inserting component assemblies into the interconnection medium in which they will be utilized. It should be understood that depending upon the particular application, changes and modifications of the tool may be required. For example, actual operative embodiments of the present tool have been used successfully to handle an integrated circuit package assembly comprised of a 68 lead package, approximately one inch square in size and having a heat sink and protective block for the leads. However, the features described herein may be applied to inserters for large size packages containing a greater number of pairs. It is thus apparent that the dimensions of various parts of the tool, which bear a relation to the geometry of the package to be inserted, must be chosen accordingly. Such variations as are within the skill of the designer, and which do not depart from the true scope and spirit of the invention are intended to be covered by the claims which follow.

What is claimed is:

1. A tool for receiving an electronic circuit package assembly which includes a lead-type package and a multi-apertured block for protecting the package leads, and for inserting said leads into a printed circuit board, comprising:

a body member of substantially rectangular cross section and having a central longitudinal aperture therein, a pair of side plates immovably affixed to a respective first pair of opposite sides of said body member and extending longitudinally therebeyond, said side plates having respective longitudinal grooves therein, a pair of ejector rods slidably disposed in said grooves, a shaft slidably disposed in said aperture of said body member, a coaxial spring member situated in said aperture and enclosing a portion of said shaft, means coupling said ejector rods to said shaft, a generally "H" shaped support member immovably affixed between said plates, a pair of substantially planar gripper members pivotably coupled to said support member and disposed adjacent the respective second pair of opposite sides of said support member, said gripper members having respective jaw-like sections at the extremities thereof, said jaw-like sections being normally biased to a closed condition, means for opening said jaw-like sections whereby said tool is preset to receive said package assembly, means coupled to said support member and responsive to contact with said package assembly for causing said jaw-like sections to close upon opposed edges of said lead-type package, the application of an external force to said shaft in the direction of said package assembly causing movement of said shaft in opposition to said coaxial spring member and concomitant movement of said ejector rods, the latter removing said multi-apertured block from said package leads in preparation for the insertion of the latter into said printed circuit board.

2. A tool as defined in claim 1 further characterized in that said aperture of said body member comprises first and second contiguous bores of respective different diameters, said shaft having first and second coaxial cylindrical sections having diameters capable of being accommodated respectively by said first and second bores, said coaxial spring member substantially encompassing said second shaft section and being interposed between an extremity of said first bore and the shoulder provided by said first section of said shaft.

3. A tool as defined in claim 2 further characterized in that said generally "H" shaped support member includes a central bore, a bolt-like member slidably disposed in said last mentioned bore, said gripper members being pivotally attached to respective opposite sides of said support member within the legs of the "H", each of said gripper members having a centrally disposed tang, spring means interposed between said tang and a surface of said support member, said spring means tending to bias each of said jaw-like sections to a closed position relative to an edge of said lead-type package.

4. A tool as defined in claim 3 wherein said means coupled to said support member and responsive to contact with said package assembly includes a pressure/ejection plate fastened to one extremity of said bolt-like member, a plurality of springs interposed between adjacent surfaces of said support member and said pressure/ejection plate, the latter having on opposite sides thereof a respective pair of projecting pieces, said pieces contacting respectively the inner surfaces of said gripper members, said means for opening said jaw-like sections permitting compressive forces to be applied by said last mentioned plurality of springs to said pressure/ejection plate, thereby causing said projecting pieces to bear against the lower portions of said gripper members and to maintain the latter in an open position in opposition to the closing bias provided by said spring means associated with the tangs of said gripper members, said gripper members having respective shallow depressions in said inner surfaces, contact between said pressure/ejection plate and said package assembly resulting in movement of said last mentioned plate by way of said bolt-like member and the compression of the springs associated therewith, said projecting pieces entering and being retained within said shallow depressions, thereby permitting said jaw-like extensions to close upon the edges of said lead-type package.

5. A tool as defined in claim 4 further including a pair of cover plates disposed respectively over said side plates to retain said ejector rods in said longitudinal grooves.

6. A tool as defined in claim 5 wherein said means for opening said jaw-like sections of said gripper members is a lever-actuated mechanism pivotably mounted adjacent an extremity of one of said pair of side plates, said mechanism straddling said body member, said gripper members having respective tapered extremities opposite to those extremities having said jaw-like sections, said mechanism including a pair of adjustable set screws having rounded portions situated in proximity to said tapered extremities of said gripper members, said mechanism being spring loaded, the application of an external force to said mechanism in opposition to the spring loading, bringing said rounded portions of said set screws into wiping contact with said tapered extremities, the movement of the latter toward said body member permitting said projecting pieces of said pressure/ejection plate to bear against said lower portions of said gripper member and to hold said jaw-like sections in an open position.

7. A tool as defined in claim 6 wherein each of said side plates includes at the free extremity thereof, a pair of narrow foot-like extensions disposed at the respective corners thereof, said package assembly having a generally rectangular profile, the corners of the rectangle having a predetermined configuration, said foot-like extensions having respective configurations complementary to those of said package assembly to provide for the keying of said package assembly with said tool.

8. A tool as defined in claim 7 wherein three of the four foot-like extensions of said side plates contain locator pins, the latter providing for the keying of said tool with respect to the desired insertion position of said package on said printed circuit board.

9. A tool as defined in claim 8 wherein each of said jaw-like sections includes a plurality of spaced-apart teeth positioned along its extremity to provide clearance for the package leads adjacent said last mentioned extremity.

10. A tool as defined in claim 9 further characterized in that said body member includes two thin planar sections extending beyond and at right angles to the respective opposite sides thereof, said planar sections of said body member providing finger holds for said application of external forces to said shaft and said lever-activated mechanism.

* * * * *